United States Patent
Yamada et al.

(10) Patent No.: US 7,401,277 B2
(45) Date of Patent: Jul. 15, 2008

(54) SEMICONDUCTOR INTEGRATED CIRCUIT AND SCAN TEST METHOD THEREFOR

(75) Inventors: Takamitsu Yamada, Kanagawa-Ken (JP); Yasutaka Tsukamoto, Kanagawa-Ken (JP); Hidetaka Minami, Kanagawa-Ken (JP)

(73) Assignee: Ricoh Company, Ltd., Tokyo (JP)

( * ) Notice: Subject to any disclaimer, the term of this patent is extended or adjusted under 35 U.S.C. 154(b) by 479 days.

(21) Appl. No.: 10/763,255

(22) Filed: Jan. 26, 2004

(65) Prior Publication Data

US 2004/0187058 A1 Sep. 23, 2004

(30) Foreign Application Priority Data

Jan. 28, 2003 (JP) .............................. 2003-018920

(51) Int. Cl.
*G01R 31/28* (2006.01)
*G06K 5/04* (2006.01)

(52) U.S. Cl. ...................... 714/726; 714/733; 714/699

(58) Field of Classification Search ......... 714/724–727, 714/729, 733, 731, 734, 744, 30, 699–701, 714/707, 500, 503; 713/400, 500, 503
See application file for complete search history.

(56) References Cited

U.S. PATENT DOCUMENTS

| | | | |
|---|---|---|---|
| 5,805,608 A * | 9/1998 | Baeg et al. .................. | 714/726 |
| 5,812,562 A * | 9/1998 | Baeg ......................... | 714/726 |
| 6,018,815 A * | 1/2000 | Baeg ......................... | 714/726 |
| 6,021,513 A * | 2/2000 | Beebe et al. ................. | 714/726 |
| 6,587,979 B1 * | 7/2003 | Kraus et al. .................. | 714/720 |
| 6,654,920 B1 * | 11/2003 | Hetherington et al. ....... | 714/733 |
| 6,957,403 B2 * | 10/2005 | Wang et al. ................... | 716/3 |
| 2003/0204802 A1 * | 10/2003 | Sim ........................... | 714/726 |

FOREIGN PATENT DOCUMENTS

| | | |
|---|---|---|
| JP | 10-242283 | 9/1998 |
| JP | 2000-115147 | 4/2000 |
| JP | 2000-261310 | 9/2000 |
| JP | 2000-332733 | 11/2000 |
| JP | 2002-56044 | 2/2002 |
| JP | 2002-203001 | 7/2002 |

OTHER PUBLICATIONS

"A Token Scan Architecture for Low Power Testing", p. 660, Proc. International Test Conference 2001, Oct. 30, 2001, Baltimore, MD USA.

* cited by examiner

*Primary Examiner*—Phung M Chung
(74) *Attorney, Agent, or Firm*—Dickstein Shapiro LLP

(57) ABSTRACT

A method for performing scan test on a semiconductor integrated circuit including at least two blocks to be tested. The method includes isolating each of the at least two blocks to be tested exclusively from further blocks; and supplying a plurality of scan clocks having different phases each to each of the at least two blocks. In addition, a semiconductor integrated circuit includes at least two blocks to be tested, an Core Wrapper Architecture isolation unit for isolating each of the at least two blocks to be tested exclusively from further blocks, and an input terminal for inputting a plurality of scan clocks each to each of the at least two blocks, in which a Wrapper register included in the Core Wrapper Architecture is configured to be supplied selectively with one of a scan clock and a system clock for the blocks.

24 Claims, 13 Drawing Sheets

SEMICONDUCTOR INTEGRATED CIRCUIT AND SCAN TEST METHOD THEREFOR

FIELD OF THE INVENTION

This patent specification relates to a method and a system for scan test, and improvements thereof to be applied to a semiconductor integrated circuit.

This application claims priority and contains subject matter related to Japanese Patent Application No. 2003-18920, filed with the Japanese Patent Office on Jan. 28, 2003, the entire contents of which are hereby incorporated by reference.

BACKGROUND OF THE INVENTION

The standardization has been in progress recently on the method for testing integrated circuit cores mounted on a system-on-chip, as exemplified by IEEE P1500: Core Wrapper Architecture.

According to this standard, scannable flip-flops called 'Wrapper register' are provided on the peripheries of the cores, this makes the access becomes feasible to the cores from the exterior of LSI by means of serial signal transfer capability of the Wrapper register.

There connected to the Wrapper register are WPI (Wrapper Parallel Input) led to the input, and WPO (Wrapper Parallel Output) led to the output of the core. They are each connected serially to the Wrapper register and make it feasible to either apply test (test signals) for scanning the status of core ports or input serial test signals from the exterior.

The origin on the side of serial input to the Wrapper register is called WSI (Wrapper Serial Input), while the terminal on the side of serial output is WSO (Wrapper Serial Output). These WSI and WSO are interconnected to further WSI and WSO, which are provided separately in another core, so that a series can be formed.

Instructions to Wrapper register concerning to scanning and test application are controlled by WSC (Wrapper Serial Control). The WSC may connect to a command register of Boundary-scan Testing: IEEE 1149.1, or have their own command registers (WIR: Wrapper Instruction Register) to be arranged between TDI (test data in) and TDO (test data out) of the Boundary-scan Testing.

The Wrapper register is capable of transiting to safe mode through the control by the WSC or WIR. In the safe mode, the scan register in the interior of WPI operates to latch a logical value, 1 or 0, regardless of the state of the exterior of the core, while WPO controls the state of core output to either Hi-z state or logical value 1,0 regardless of the state within the core. Namely, in the safe mode, the core is excluded from the effects of external logics; namely the core is brought into the state separated from the exterior.

The type of core to be applicable to the Core Wrapper Architecture is not necessarily limiting. For example, after hierarchically dividing logics into modules with respect to function, Wrapper registers may be provided to ports of thus formed modules. Alternatively, Wrapper registers may be allocated to each layout block formed by hierarchical layout.

(1) Difficulty of Voltage Drop in Large Scale Circuits During Scan Test

Voltage drops in semiconductor chips are caused in general by parasitic resistance of power source wiring and current flowing through the resistance.

The degree of voltage drop at an arbitrary point j, '$\Delta Vj$', is obtained as the product of two quantities, one the cumulative total of the parasitic resistance of source wiring up to the point j, 'Rj', and the other the amount of current flowing through the point j, 'Ij';

$$\Delta Vj = Ij \times Rj \quad (1).$$

Namely, the greater the number of cells operating simultaneously, the larger becomes the amount of current flowing in an instance. As a result, the voltage drop increases accordingly.

In addition, the larger the size of chip, the longer becomes the length of source wiring, so that the resistance increases. (Layout techniques through the analysis of voltage drops including preventive features have been disclosed in Japanese Laid-Open Patent Applications No. 2002-56044, 10-242283 and 2002-203001.)

In the case of scan test where the currents flow into all scan flip-flops included in an LSI in synchronous with a scan clock, this results in an instantaneous voltage drop. Therefore, for IC chips of relatively large size, difficulties are encountered more often such as the occurrence of scan test malfunction caused by the voltage drop, for example.

The techniques for averting the noted difficulties have been published as follows; a plurality of scan clocks is prepared and the phase of the scan clocks is made asynchronous with each other by means of a multi-phase generator provided in an LSI.

As a result, the scan flip-flops included in LSI can be prevented from operating simultaneously (Tsung-Chu Huang et al, "A Token Scan Architecture for Low Power Testing", p.660, Proc. International Test Conference 2001 IEEE, October 30, Baltimore Md., USA).

In this method, however, there still left unresolved is the mismatch of the phase of the plural scan clocks, this arises difficulty of another malfunction caused by clock skew.

In addition, the above publication has also proposed the technique. in which, by dividing the scan chain and providing scan clocks exclusively in each of the divided blocks, the number of scan flip-flops simultaneously operating during test scan can decrease. In this technique, however, the original advantage of parallel operation is impaired, thereby giving rise to prolonging test time.

(2) Difficulty of Metastable State Propagation in Asynchronous Circuits

In an LSI provided with a plurality of system clocks each having different rates, there is possibility of causing metastable state during data exchange among different clocks.

This metastable state is known to cause system delay and malfunction. As a previous method for positively preventing this difficulty, flip-flops have been provided to synchronize asynchronous signals on the signal reception side of the logic.

Accordingly, in the method of scan test on large scale integrated circuits and in the case where all scan flip-flops included in the circuits are operated in synchronous one another with scan clock, an instantaneous voltage drop and scan test malfunction may result. Although techniques for averting the difficulties have been disclosed as described earlier by providing multiple scan clocks to thereby properly shift the phase of the clock and avoid the voltage drop, here gives rise to difficulties of skew and concomitant malfunction.

It is therefore desirable in the present disclosure the scan test is carried out on each of the blocks in parallel unaffected by surrounding logics and the skew between blocks can be avoided. Furthermore, the difficulty of voltage drop is also prevented.

As also described earlier, the addition of flip-flops are disclosed to achieve the synchronization to thereby alleviate the occurrence of the metastable state. However, this technique may have several problems remained unsolved such as a required areal overhead, omission of needed flip-flop, and further examination of method for confirming the flip-flop.

It is also desirable, therefore, to prevent the occurrence of the metastable state by using Wrapper register provided on the peripheries of the cores (or block).

Furthermore, another difficulty of fault detection described earlier has to be considered, which is caused by the safe mode capability.

That is, the core in the safe mode is excluded from the effects of external logics, and brought into the state separated from the exterior. Since the core is fixed to the state held by the Wrapper register in the safe mode, it becomes difficult in fault detection with ATPG (Auto Test Pattern Generation) to carry out the fault detection on logics provided between the Wrapper register and FF (flip-flop) included in the block. This is also true for the fault detection with BIST (Built-In Self Test).

It is therefore desirable to avert the difficulty in fault detection, and to thereby improve detection rate in such detections.

SUMMARY

Accordingly, it is an object of the present disclosure to provide a method and system for scan test to be in use for a semiconductor integrated circuit, having most, if not all, of the advantages and features of similar employed methods and systems, while eliminating many of the aforementioned disadvantages.

The following brief description is a synopsis of only selected features and attributes of the present disclosure. A more complete description thereof is found below in the section entitled "Description of the Preferred Embodiments"

To achieve the foregoing and other objects, and overcome the disadvantages discussed above, a method is provided for performing scan test on a semiconductor integrated circuit including at least two blocks to be tested each capable of performing active functions. The method includes at least the steps of isolating each of the at least two blocks to be tested exclusively from further blocks, and supplying a plurality of scan clocks each to each of the at least two blocks, in which the plurality of scan clocks each have a phase different from each other.

In another aspect disclosed herein, a semiconductor integrated circuit for use in the above noted method is provided including at least two blocks to be tested each capable of performing active functions, an isolation unit for isolating each of the at least two blocks to be tested exclusively from further blocks, and an input terminal for inputting a plurality of scan clocks each to each of the at least two blocks, in which the plurality of scan clocks each have the phase different from each other.

In this semiconductor integrated circuit, each of the at least two blocks is provided with a Core Wrapper Architecture as the isolation unit, and a Wrapper register included in the Core Wrapper Architecture is configured to be supplied selectively with one of a scan clock and a system clock for the blocks.

In addition, the semiconductor integrated circuit further includes an internal scan chain in each of the at least two blocks, in which
   a shift enable signal for the Wrapper register is connected to a scan enable signal for the internal scan chain,
   a clock for the Wrapper register is synchronous with a scan clock for the internal scan chain in the semiconductor integrated circuit, and
   serial-in and serial-out terminals of the Wrapper register are each connected to an exterior of the semiconductor integrated circuit, so that an application of scan data from a tester and an observation of results obtained from a test of the application both become feasible.

Furthermore, the semiconductor integrated circuit further includes a logic BIST in each of the at least two blocks, in which serial-in and serial-out terminals of the Wrapper register are connected to an output of PRPG, and an input of MISR, of the logic BIST, respectively, each in parallel with the internal scan chain between PRPG and MISR.

In still another aspect disclosed herein, a tester in use for applying the above noted method to the semiconductor integrated circuit again above noted.

The present disclosure and features and advantages thereof will be more readily apparent from the following detailed description and appended claims when taken with drawings.

DESCRIPTION OF THE PREFERRED EMBODIMENTS

Figure 1:
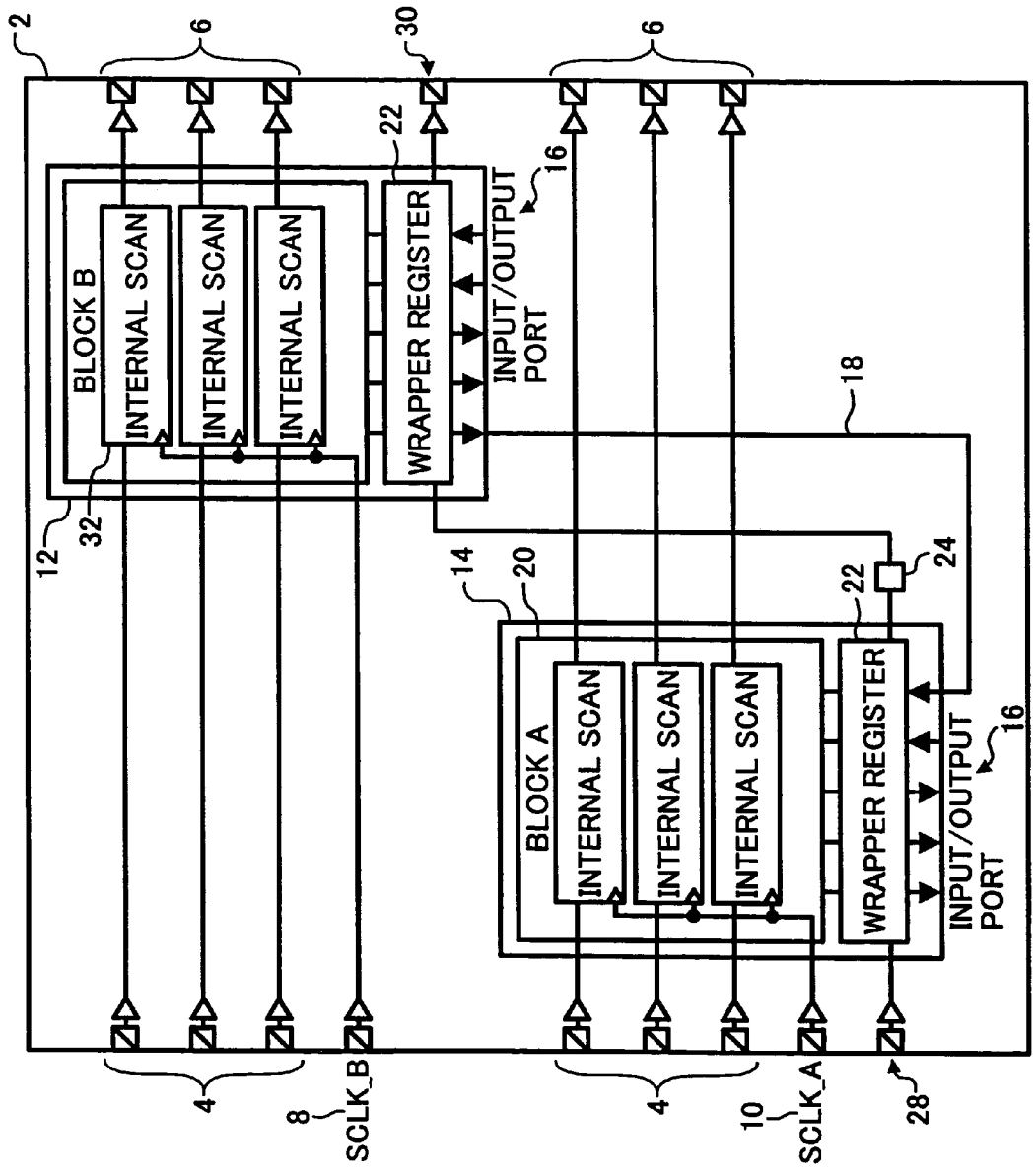
FIG. 1 is a diagrammatic block diagram illustrating a semiconductor integrated circuit according to one embodiment disclosed herein.

In the detailed description which follows, specific embodiments of the methods of scan test applied onto semiconductor integrated circuits and the integrated circuits adapted to such test are described, which are particularly useful for large scale integrated semiconductor circuits.

It is understood, however, that the present disclosure is not limited to these embodiments. For example, the method of scan test disclosed herein may also be adaptable to any form of circuit testing. Other embodiments will be apparent to those skilled in the art upon reading the following description.

In the present disclosure, a method is provided for performing scan test on a semiconductor integrated circuit including at least two blocks to be tested each capable of performing active functions. This method includes at least the steps of isolating each of the at least two blocks to be tested exclusively from further blocks, and supplying a plurality of scan clocks each to each of the at least two blocks, in which the plurality of scan clocks each have a phase different from each other.

According to an alternate embodiment, a semiconductor integrated circuit for use in the above noted method is provided including at least two blocks to be tested each capable of performing active functions, an isolation unit for isolating each of the at least two blocks to be tested exclusively from further blocks, and an input terminal for inputting a plurality of scan clocks each to each of the at least two blocks, in which the plurality of scan clocks each having the phase different from each other.

In another embodiment, a further semiconductor integrated circuit for use in the above noted method is provided including at least two blocks to be tested each capable of performing active functions, an isolation unit for isolating each of the at least two blocks to be tested exclusively from further blocks, and a clock generator for generating a plurality of scan clocks based on a clock input from the exterior each to be supplied to each of the at least two blocks, in which the plurality of scan clocks each having the phase different from each other.

In these semiconductor integrated circuits, each of the at least two blocks is provided with a Core Wrapper Architecture as the isolation unit, and a Wrapper register included in the Core Wrapper Architecture is configured to be supplied selectively with one of a scan clock and a system clock for the blocks, In addition, the semiconductor integrated circuits each additionally include an internal scan chain in each of the at least two blocks, in which
 a shift enable signal for the Wrapper register is connected to a scan enable signal for the internal scan chain,
 a clock for the Wrapper register is synchronous with a scan clock for the internal scan chain in the semiconductor integrated circuit, and
 serial-in and serial-out terminals of the Wrapper register are each connected to an exterior of the semiconductor integrated circuit, so that an application of scan data from a tester and an observation of results obtained from a test of the application both become feasible.

Still in addition, the semiconductor integrated circuits each includes a logic BIST in each of the at least two blocks, in which serial-in and serial-out terminals of the Wrapper register are connected to an output of PRPG, and an input of MISR, of the logic BIST, respectively, each in parallel with the internal scan chain between the PRPG and the MISR.

In yet another embodiment, a tester is provided for applying the method described earlier to these semiconductor integrated circuits.

Having described the present disclosure in general, the following examples are provided further to illustrate preferred embodiments of the invention.

Exemplary Embodiment 1

FIG. 1 is a diagrammatic block diagram illustrating a semiconductor integrated circuit 2 according to one embodiment disclosed herein.

Referring to FIG. 1, the semiconductor integrated circuit 2 is provided at least with an input buffer 4 for scan-in and output buffer 6 for scan-out.

Although the first and second system clocks 8 and 10 are applied to blocks B12 and A14, respectively, clock frequencies therefrom are different one another. In addition, these system clocks serve also as scan clocks.

By way of input/output ports 16 of the blocks B12 and A14, several operations are carried out by Wrapper register 22 such as scan, control, and observation.

The Wrapper register 22 has the capability of Core Wrapper Architecture of IEEE 1500. The logic 20 inside the block A14 can therefore be separated or disconnected by the Wrapper register 22.

The Wrapper register 22 included in the block A14 is connected serially to a further Wrapper register 22 included in the block B12 and accessible from the exterior of the semiconductor integrated circuit 2 by way of Wrapper serial input 28 and Wrapper serial output 30. A lockup cell 24 is further provided between both Wrapper registers 22, 22.

Interface signals 18 are forwarded to block A14 from block B12. Since the operation frequency is different one another for the block A14 from block B12, the noted signals are formed as asynchronous IF signals.

Internal scan chains 32 are provided in respective blocks (B12, A14). The internal scan chains are arranged not to straddle the blocks B12 and A14, which are provided with scan-in 4 and scan-out 6, respectively, in an exclusive manner.

Figure 2:
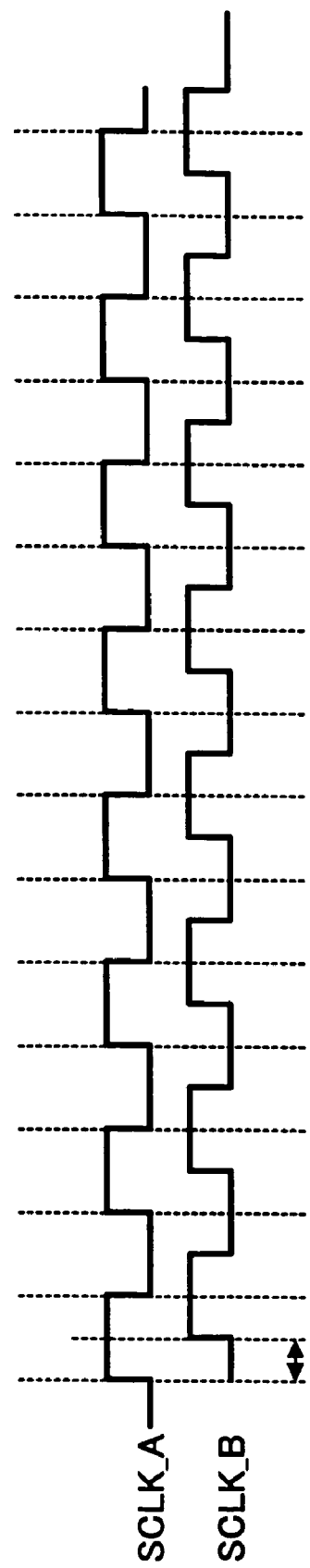
FIG. 2 illustrates the waveforms of scan clock applied to the semiconductor integrated circuit of FIG. 1 from ATE.

FIG. 2 illustrates the waveforms of scan clock applied to the semiconductor integrated circuit 2 of FIG. 1 from ATE (Automatic Test Equipment) system (which is hereinafter referred to as a tester).

Referring to FIG. 2, although the frequency is the same for both SCLK_A and SCLK_B, the phase is shifted with one another so as scan flip-flops of the blocks, A and B, not to operate simultaneously.

As described herein above, the separation of the blocks A and B from surrounding circuits is feasible by means of Wrapper register 22.

As a consequence of the present circuit construction, the interface signals 18 are interrupted from propagating to the block A14 by Wrapper register 22, so that the scan test on the block A14 can be performed unaffected by the surrounding circuits. Furthermore, no difficulty in skew arises between SCLK_A and SCLK_B.

In addition, the frequency is the same for both SCLK_A and SCLK_B, and no increase in testing time is encountered in comparison with previous scan tests.

Figure 3:
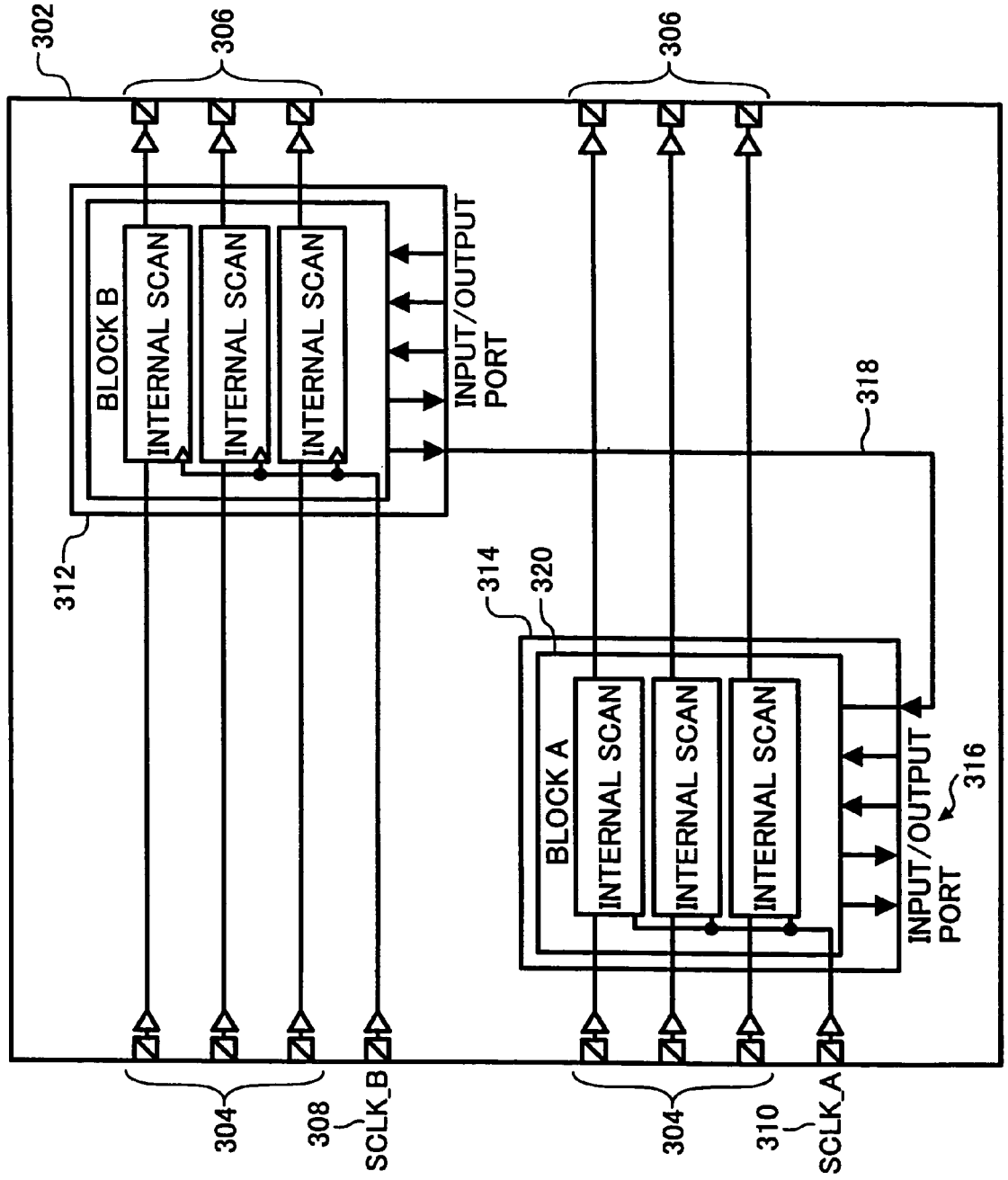
FIG. 3 is a diagrammatic block diagram illustrating a semiconductor integrated circuit previously known.

FIG. 3 is a diagrammatic block diagram prepared for purposes of comparison to illustrate a semiconductor integrated circuit 302 previously known.

When scan tests are performed on the known semiconductor integrated circuit 302 utilizing clock waveforms illustrated in FIG. 2, difficulties in skew may be encountered between SCLK_A and SCLK_B, so that the disagreement is likely to arise between the results from the scan tests and anticipated values.

If an assumption is made, in that the phase is brought into coincident, and that the noted skew is removed between SCLK_A and SCLK_B, all scan flip-flops included in the blocks A and B are made to operate according to the clocks SCLK_A and SCLK_B. This may result in a considerable voltage drop concomitantly with the operations, which result in difficulties in conducting normal scan tests.

In order to avoid such difficulties, scan tests may be carried out first only on the block A and subsequently on the block B.

Although the difficulties in skew and voltage drop can be avoided in this method, testing time has to be prolonged as described earlier.

Exemplary Embodiment 2

Figure 5:
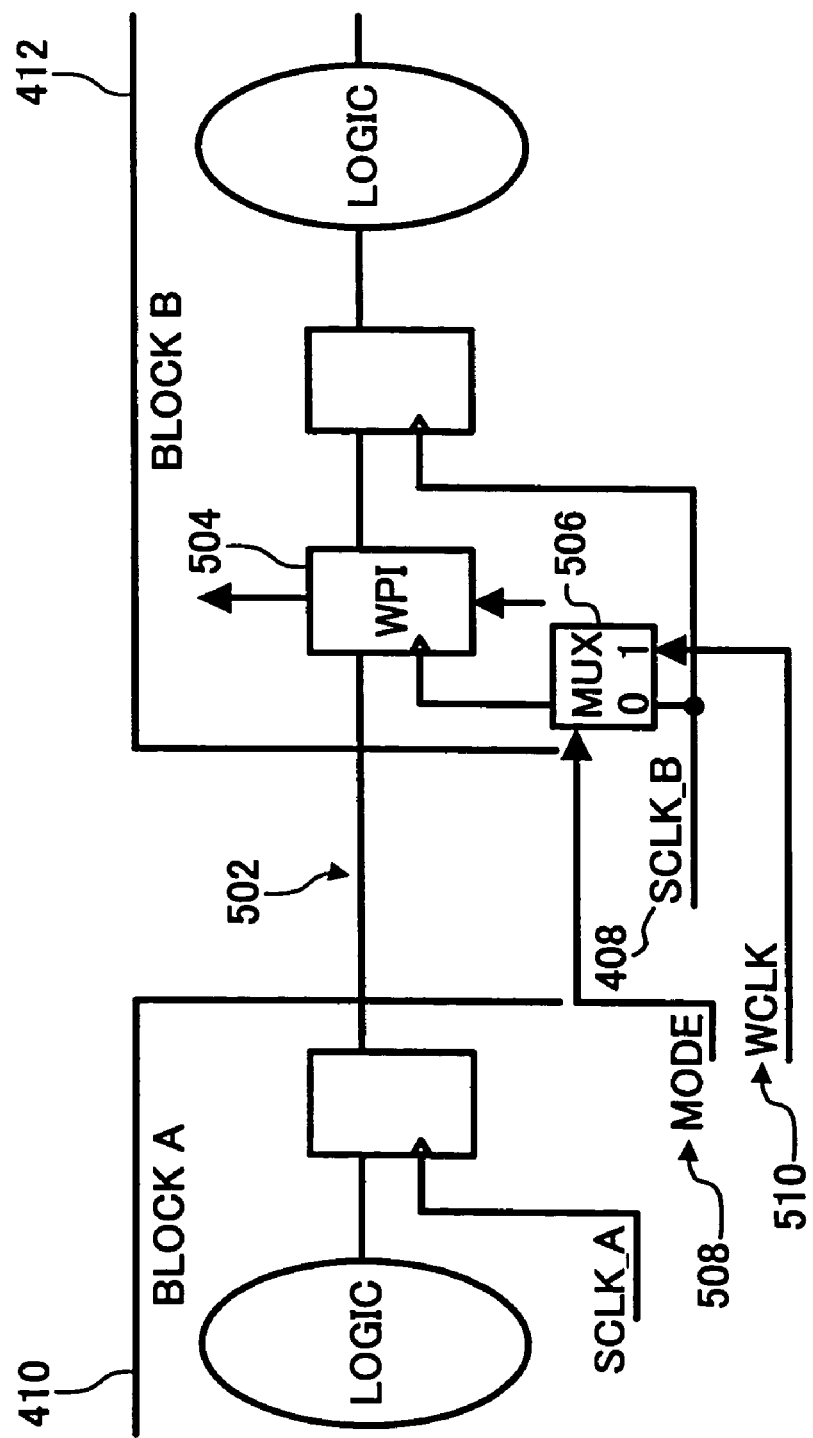
FIG. 5 is a diagrammatic block diagram illustrating a semiconductor integrated circuit according to a second embodiment disclosed herein.

FIG. 5 is a diagrammatic block diagram illustrating a semiconductor integrated circuit according to a second embodiment disclosed herein.

Figure 4:
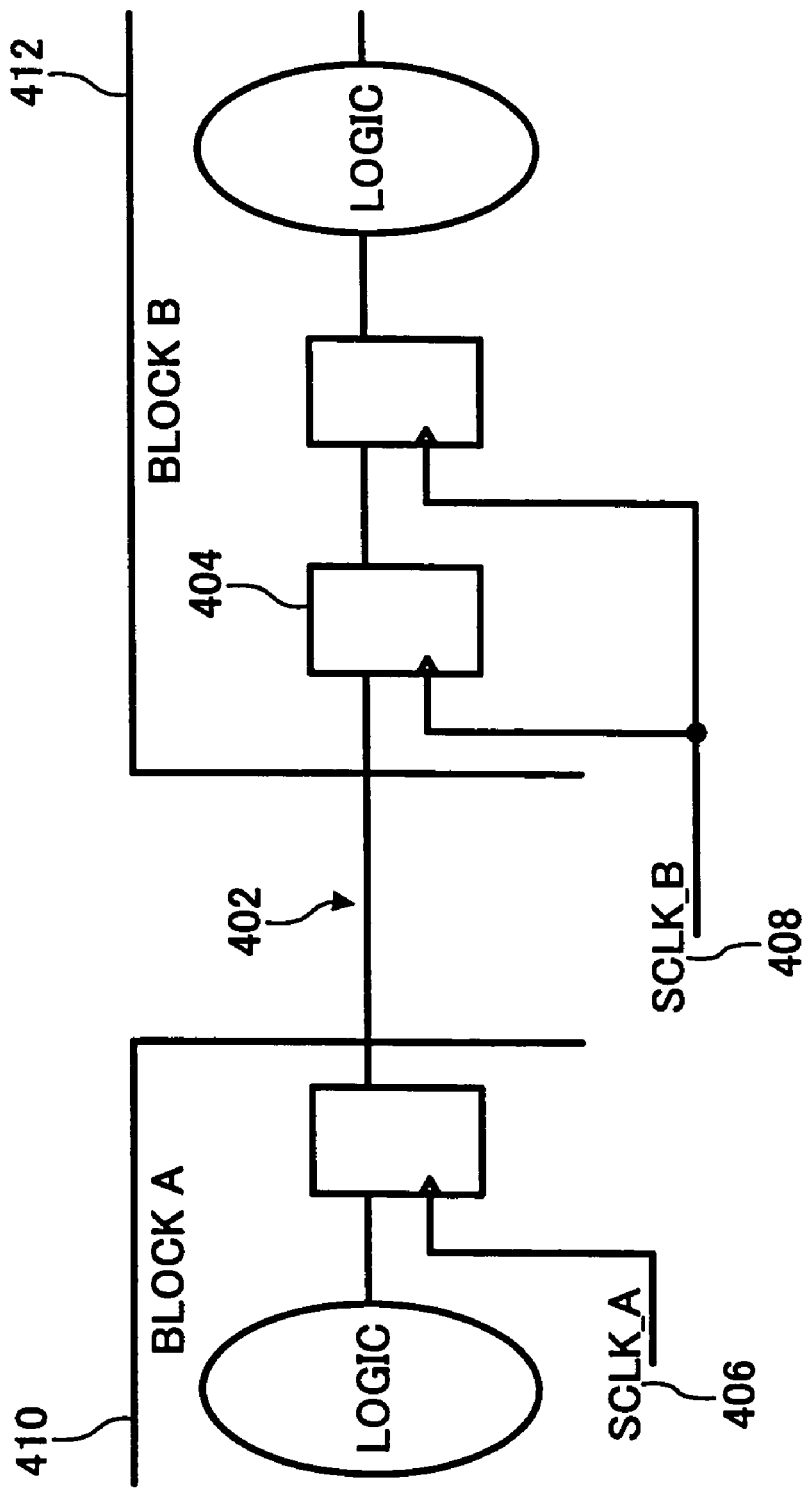
FIG. 4 is a diagrammatic block diagram illustrating a known semiconductor integrated circuit provided with metastable state preventive feature.

First, a known circuit provided with metastable state preventive feature is illustrated in FIG. 4. To the blocks A410 and B412 included in the circuit of FIG. 4, system clocks SCLK_A406 and SCLK_B408 are supplied, respectively. These clocks each have frequencies different one another.

Since the signal 402 interfacing A410 with B412 is asynchronous, it is possible a metastable state to propagate to B412. Therefore, a metastable state preventive feature is provided in the present circuit, which is attained by additionally including flip-flop 404. This flip-flop 404 operates to synchronize signals right before the propagation to the block B412.

Referring now to FIG. 5, Wrapper register 504 is provided in place of the flip-flop 404. Also, a selector 506 is provided so as to select the clocks to be supplied to the Wrapper register 504.

To the selector 506, test mode signals 508 are applied. The test mode signals 508 assume the logical value 'Hi' during the period of testing such as scan test, for example.

Namely, the selector 506 is configured to be controlled the test mode signal 508 such that WCLK 510 is selected as scan clock during test period. Otherwise (Mode='Low') SCLK_B (408) as system clock for the block is selected to be supplied to Wrapper register 22.

As a result, the Wrapper register 504 functions during test period as Wrapper register for the test, while it does function as the flip-flop for the metastable state preventive feature during the period other than the test.

Exemplary Embodiment 3

Figure 6:
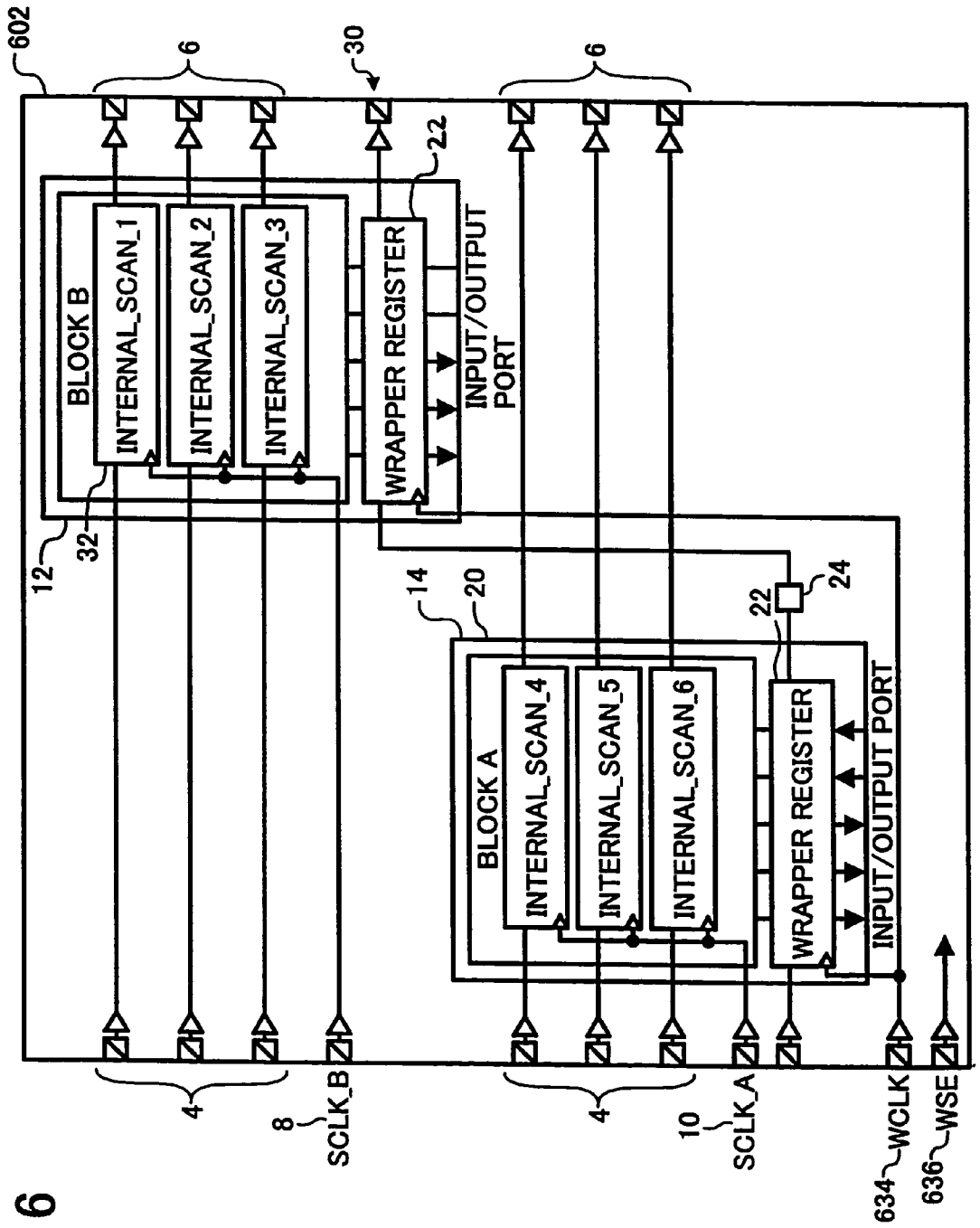
FIG. 6 is a diagrammatic block diagram illustrating a semiconductor integrated circuit according to a third embodiment disclosed herein.

FIG. 6 is a diagrammatic block diagram illustrating a semiconductor integrated circuit 602 according to a third embodiment disclosed herein. This semiconductor integrated circuit 602 has the construction similar to the integrated circuit 2 of the first embodiment, in which similar components are shown with like reference numerals and details thereon are abbreviated in the following description.

In the semiconductor integrated circuit 602 of FIG. 6, WCLK 634 is a clock supplied to Wrapper registers 22, 22 and WSE 636 serves as a scan enable signal. These clocks are both supplied to the Wrapper registers 22, 22 in blocks A and B.

Test signals are applied by tester during scan test, such that the WCLK 634 is synchronized with SCLK_A10 and SCLK_B8 and that the WSE 636 functions in the same manner as the scan enable signal for the blocks A and B.

The Wrapper registers 22, 22 provided in the blocks A and B, therefore, function as internal scan chain, respectively. As a consequence, the scan chains are formed each consisting of seven parallel scans, internal_scan_1~6, and Wrapper register.

Figure 7:
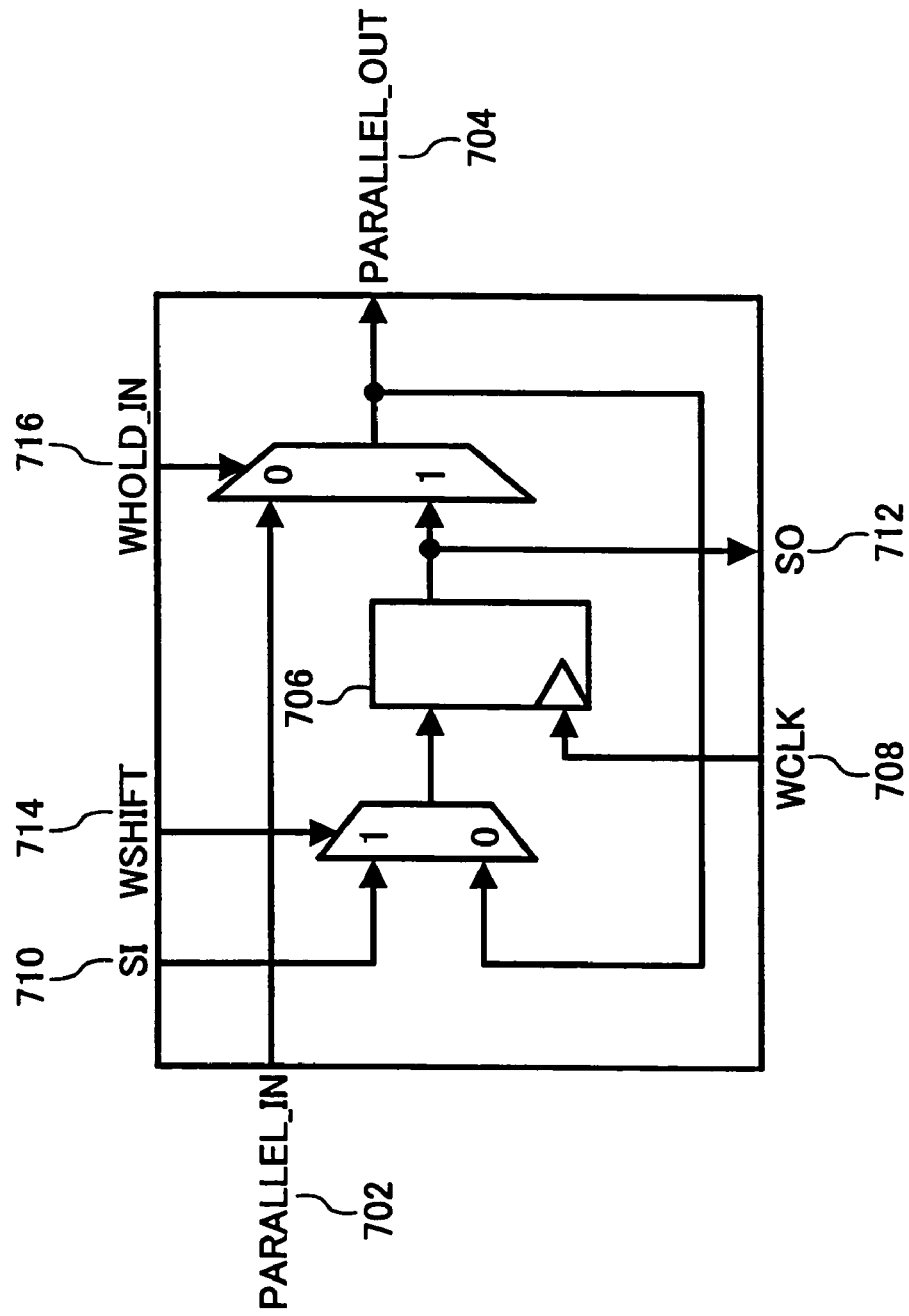
FIG. 7 is a diagrammatic block diagram prepared to exemplify a Wrapper register cell.

When the Wrapper registers 22, 22 operate as internal scan chain, they carry out self monitoring. FIG. 7 is prepared to exemplify a Wrapper register cell.

Paths 702 and 704 serve as signal line for attaining the primary capabilities of the LSI. Flip-flop 706 is provided at the center of the LSI and the WCLK 708 is clock supplied thereto. Furthermore, signal lines are additionally provided such as serial-in 710 and serial-out 712 from the Wrapper register. Control is performed by "WSHIFT" shift enable signals so as to either carry out the shift operation from the serial-in 710 to serial-out 712 or latch the signals placed on the path 702.

WHOLD_in 716 is the signal to be supplied to the selector which assumes the separation capability for the blocks. The WHOLD_in 716 assumes control of selecting the signal to be output to the path signal output 704 between the signal placed on path signal input 702 and the data held by flip-flop 706. That is, in the case of separating the block from surrounding logics, there brought about is WHOLD_in<=Hi, so that the data held by the flip-flop 706 are forwarded to the path signal output 704.

Figure 8:
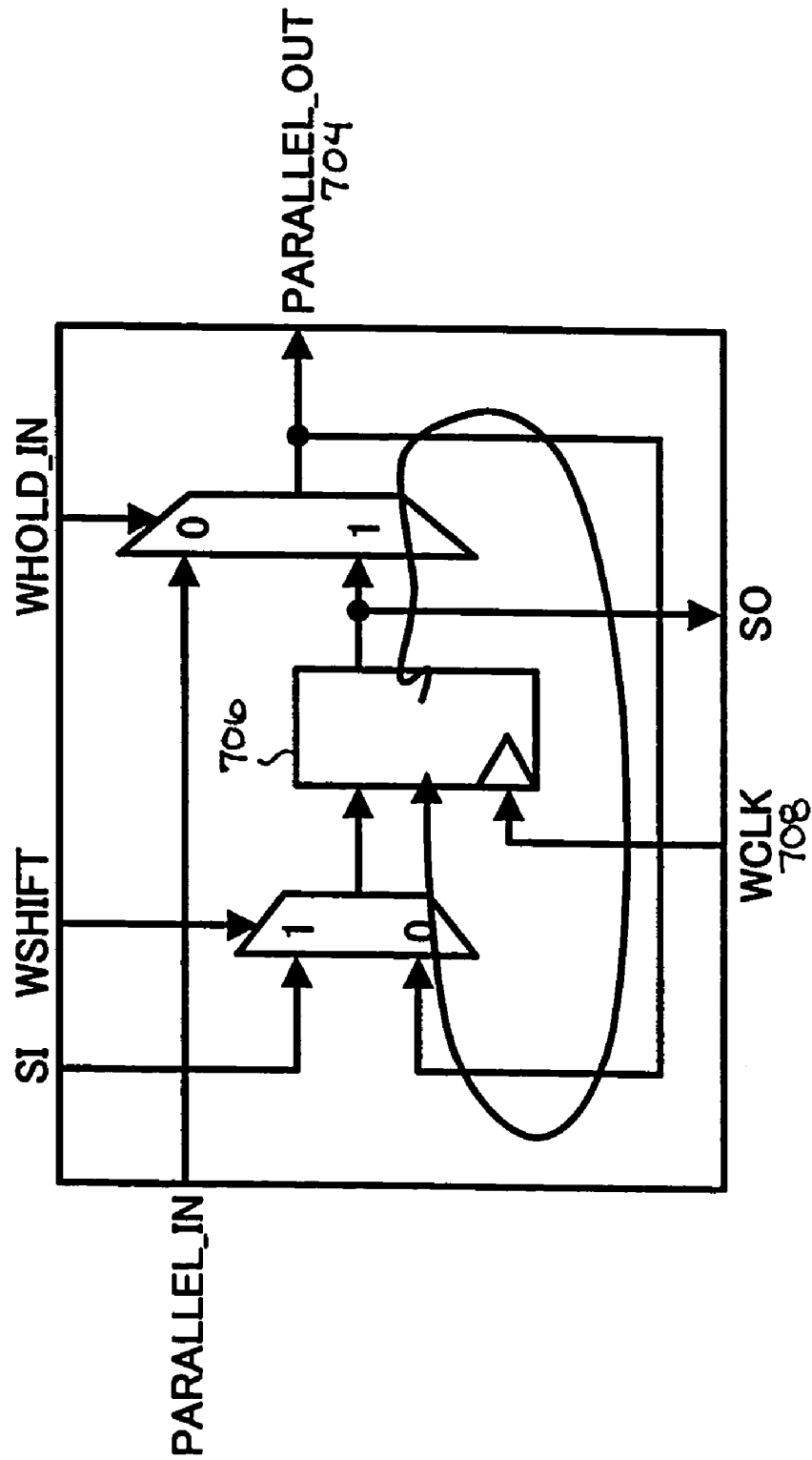
FIG. 8 is a pattern diagram for illustrating the self monitoring on the Wrapper register cell of FIG. 7.

FIG. 8 is a pattern diagram for illustrating the self monitoring on the Wrapper register cell of FIG. 7. By fulfilling the relationships, WHOLD_in<=1, and

WSHIFT<=0, the flip-flop 706 in Wrapper register operates to latch again the data held within in synchronous with the WCLK 708. At the same time, the data held by the flip-flop 706 are sent to the path signal output 704.

Therefore, the Wrapper register 22 carries out the scanning operation in the noted self monitoring mode during ATPG period in the semiconductor integrated circuit 602 in the present embodiment.

Figure 9:
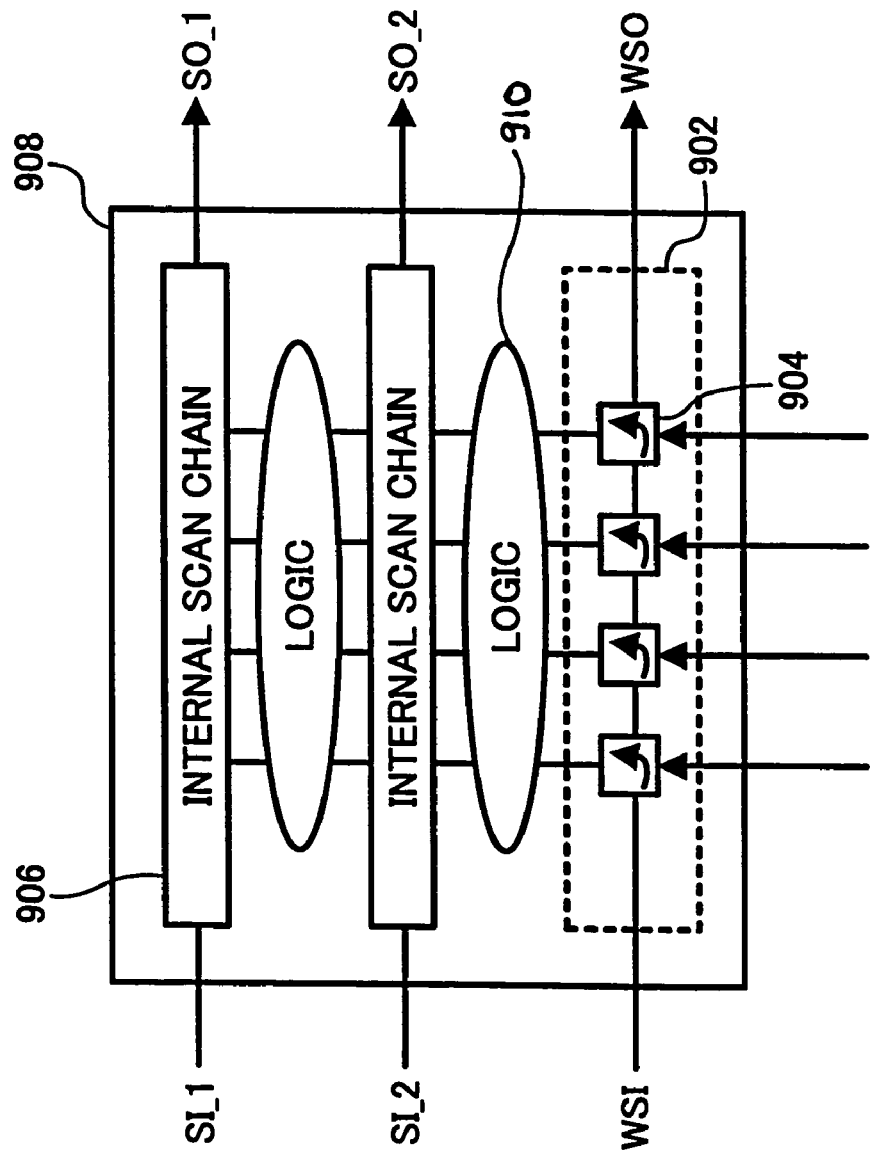
FIG. 9 is a diagrammatic block diagram illustrating another semiconductor integrated circuit previously known.

The operation of Wrapper register 22 during scan test period utilizing previously known technique will be described herein below. FIG. 9 is a diagrammatic block diagram illustrating a semiconductor integrated circuit 908 previously known.

Referring to FIG. 9, there provided are Wrapper register 902 connected to input/output port of block 908 and a scan chain 906 connected to internal logic.

The Wrapper register 902 includes Wrapper register cells 904. The block 908 is separated during scan test from surrounding logics by Wrapper register 902. Through this block separation, the state of the input into internal logics is fixed by that of the Wrapper register cells 904.

The arrow signs inside each of the Wrapper register cells 904 shown in FIG. 9 schematically indicate that the interior of the block is controlled by the register cells.

Figure 10:
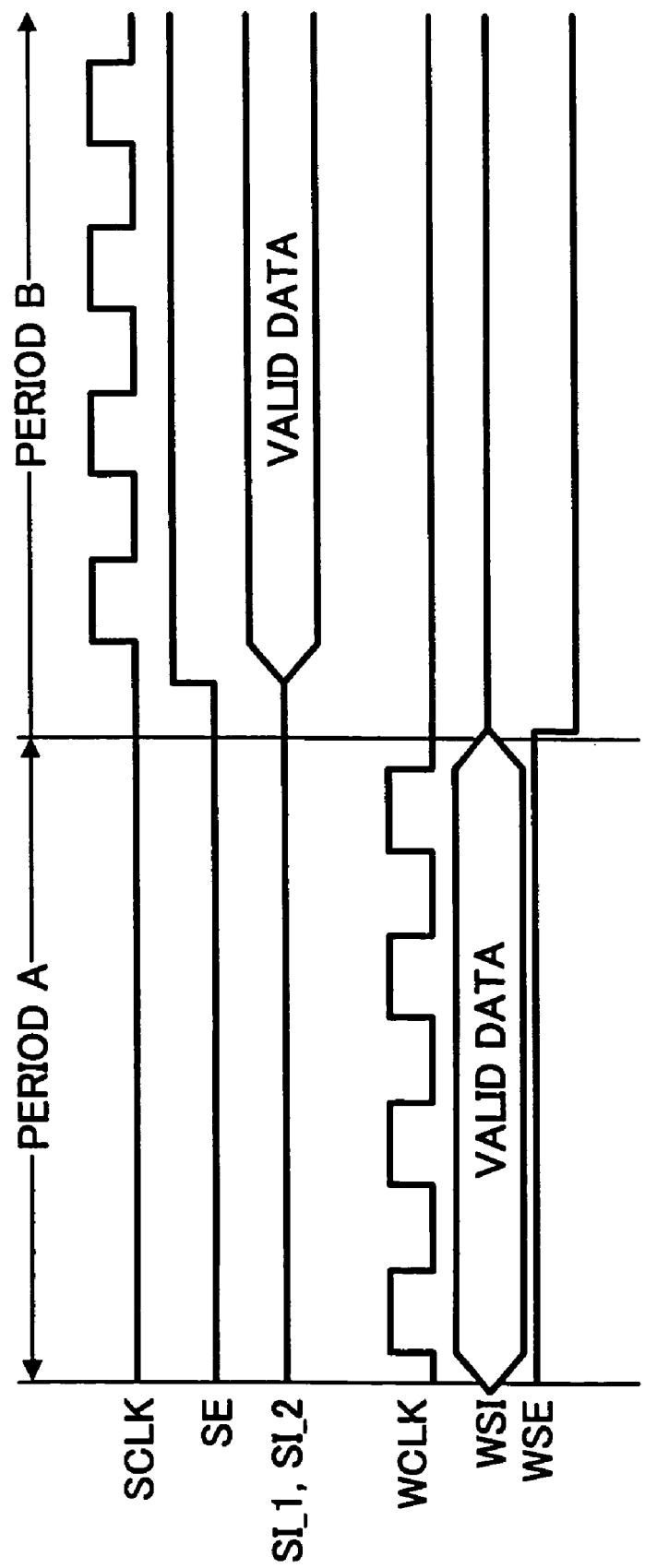
FIG. 10 includes a timing chart illustrating a test sequence of scan test preformed on the semiconductor integrated circuit of FIG. 9.

FIG. 10 includes a timing chart illustrating a test sequence of scan test preformed on the noted semiconductor integrated circuit 908.

Being the initial portion of the sequence, the period A is allocated to setting block input data into the Wrapper register. The Wrapper register alone operates during the period A and block input data are supplied serially from WSI. Upon completing the supply of block input data, the block 908 is separated from surrounding logics and the block input data set as above are supplied to the input of the block. A scan test is then carried out in this state on the block by way of internal scan chain (Period B in FIG. 10).

The input into logic 910 in this case is fixed to the block input data set during the period A shown in FIG. 9 regardless of supplying the test from ATE. This being the case, there still remain undetectable fault and un-testable fault as blocking or hindering fault and similar other faults even after the fault detection is performed by ATPG.

Figure 11:
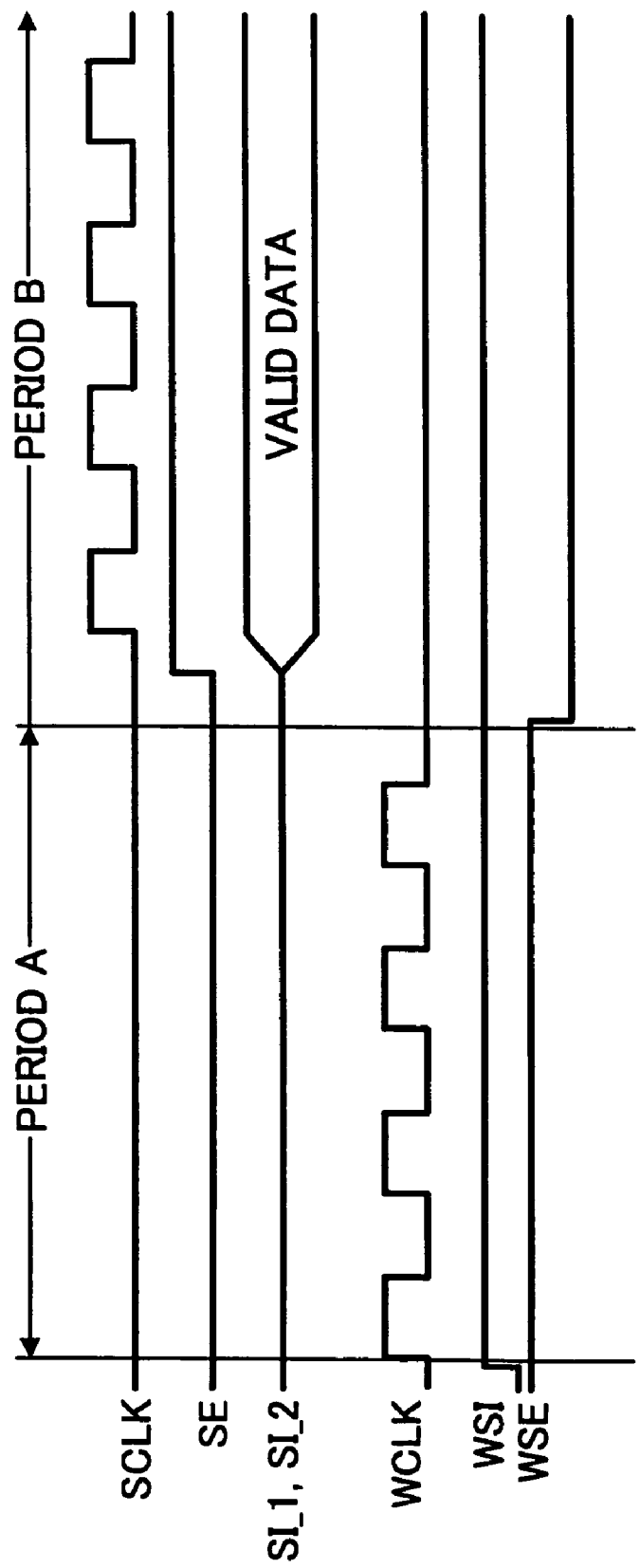
FIG. 11 includes a timing chart illustrating another test sequence of scan test preformed on the semiconductor integrated circuit, in which difficulties still remain unresolved.

Supposing a test sequence as illustrated in FIG. 11, the signal 'Hi' is applied to WSI at the time point of initialization of the block input data.

As a consequence of thus applied signal, the flip-flop in Wrapper register cell 904 is brought to the 'Hi' state at the very beginning of the period B, and accordingly the scan test in the period B has to be carried through with the block input fixed and remained as 'Hi'.

Figure 12:
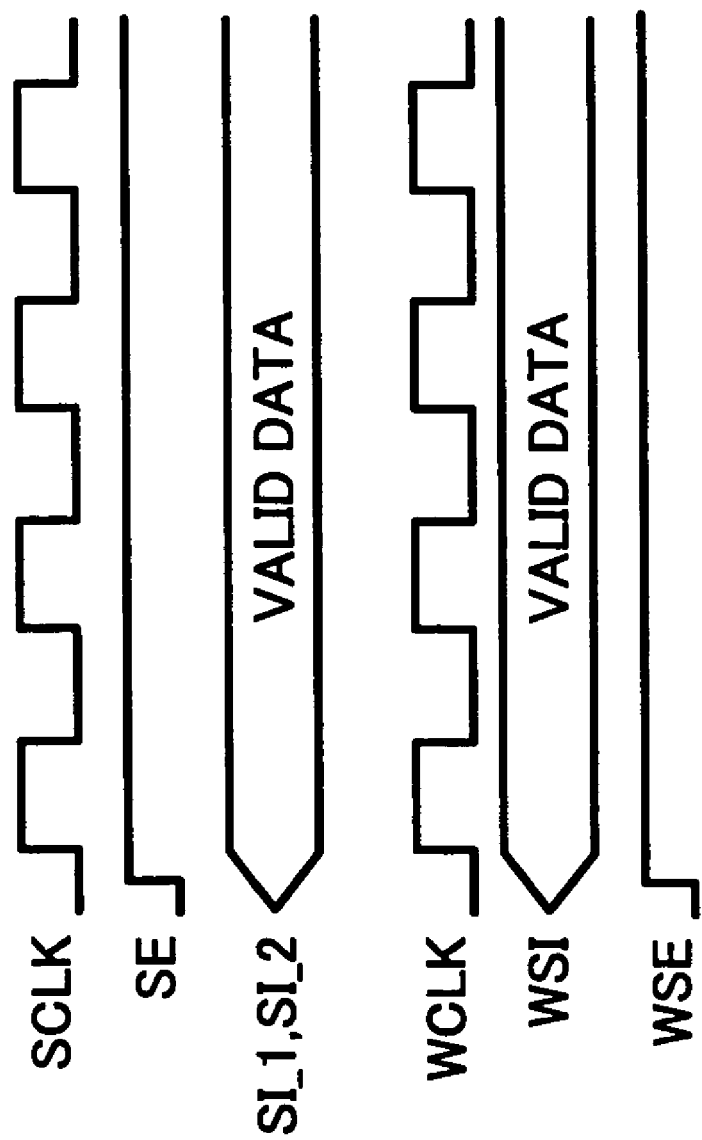
FIG. 12 includes a timing chart illustrating still another test sequence of scan test preformed on the semiconductor integrated circuit in the third embodiment, in which the earlier noted difficulties in the test can be alleviated.

FIG. 12 includes a timing chart illustrating another test sequence of scan test preformed on the semiconductor integrated circuit 602 in the third embodiment.

As illustrated in FIG. 12, an initialization period, which corresponds to the period A shown in FIG. 10, is not provided. Namely, by utilizing the Wrapper register as an internal scan chain, the scan test is carried out this time from the time of onset.

Since testing steps are supplied from ATE system to the Wrapper register sequentially in line with the test scan sequence, the test is performed thoroughly.

Consequently, the earlier noted difficulties in the test, which are revealed as partial incompletion such as the blocking fault, can now be prevented.

Exemplary Embodiment 4

Figure 13:
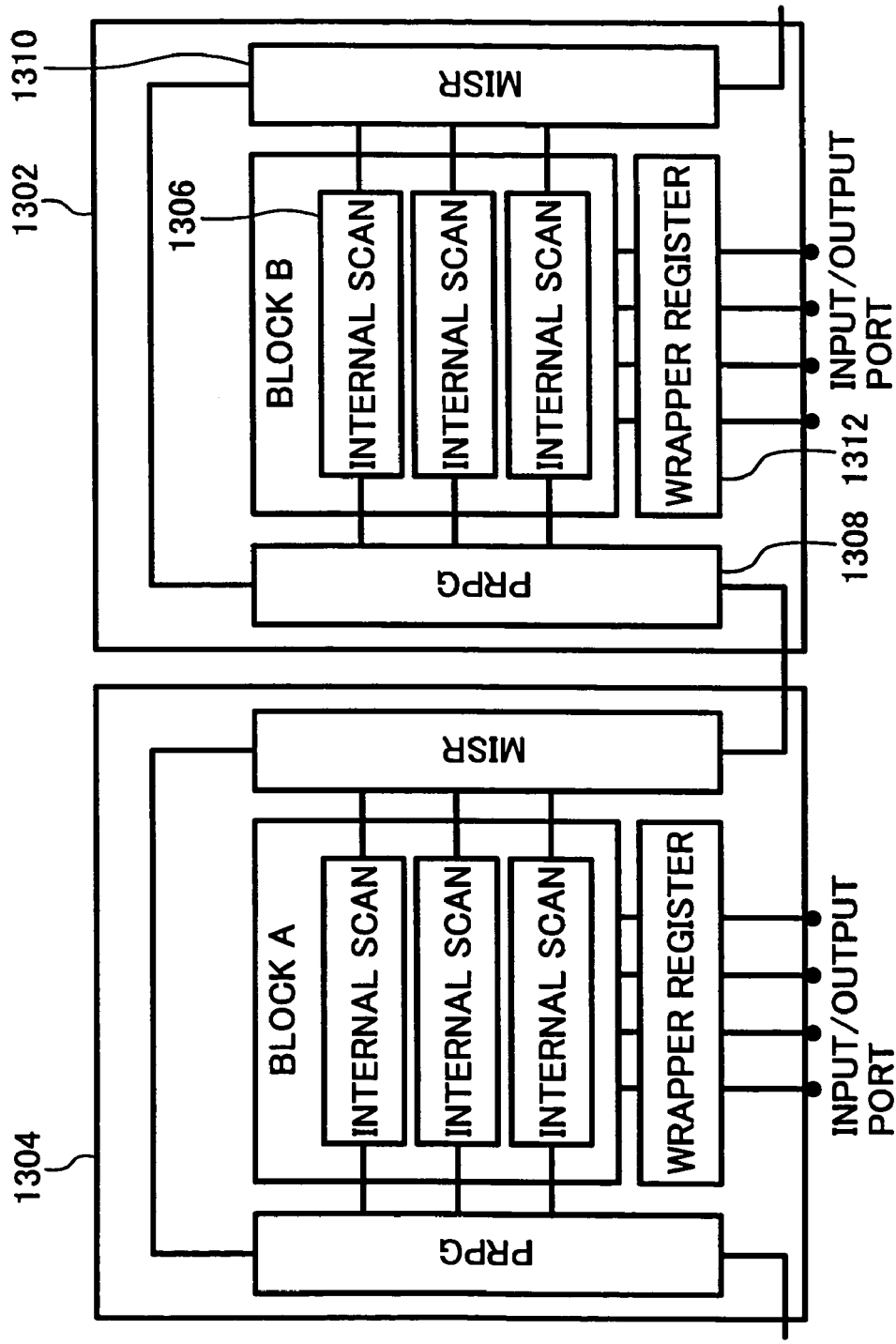
FIG. 13 is a diagrammatic block diagram illustrating a semiconductor integrated circuit according to a fourth embodiment disclosed herein.

FIG. 13 is a diagrammatic block diagram illustrating a semiconductor integrated circuit according to a fourth embodiment disclosed herein.

Referring to FIG. 13, the semiconductor integrated circuit is provided with either blocks in use for performing a hierarchical layout or logical hierarchical blocks (1302, 1304) for a flat layout.

The blocks (1302, 1304) are each provided therein with scan chains 1306, PRPGs (Pseudo-Random Pattern Generators) 1308 and MISRs (Multiple Input Signature Registers) 1310 for logic BIST. These logic BISTs are individually arranged to be capable of performing the test independent from one another.

The PRPGs 1308 and MISRs 1310 each include shift registers of LFSR (Linear Feedback Shift Register). In addition, the PRPGs 1308 and MISRs 1310 are connected serially each other to be accessible from the exterior of LSI.

Each of Wrapper register 1312 is arranged in parallel with the scan chain 1306 between PRPG 1308 and MISR 1310.

The Wrapper register 1312 herein is configured to separate the block from the surrounding logics and prevent from the x-propagation from the exterior.

The process steps set forth in the present description may therefore be implemented using suitable host computers and terminals incorporating appropriate processors programmed according to the teachings disclosed herein, as will be appreciated to those skilled in the relevant arts. Appropriate software coding can readily be prepared by skilled programmers based on the teachings of the present disclosure as will be apparent to those skilled in the arts Therefore, the present disclosure also includes a computer-based product which may be hosted on a storage medium and include instructions which can be used to program a processor to perform a process in accordance with the present disclosure. The storage medium can include, but is not limited to, any type of disk including floppy disks, optical disks, CD-ROMs, magneto-optical disks, ROMs, RAMs, EPROMs, EEPROMS, flash memory, magnetic or optical cards, or any type of media suitable for storing electronic instructions.

It is apparent from the above description including the examples the present scan test method to be applied to semiconductor integrated circuits has several advantages over similar methods previously known.

For example, by subjecting the LSI to the block division or hierarchical division and providing a Wrapper register in each of the divided blocks, the effects of surrounding logics onto the block are prevented and proper scan test operation on the blocks becomes feasible.

In addition, since the phase of scan clock supplied from the tester (ATE system) can be shifted appropriately, the number of scan flip-flops simultaneously operated during test scan can be reduced to the number within the block.

As a result, previous difficulties such as the voltage drop during scan test and the skew between blocks can be avoided, and the scan test on LSIs becomes feasible without increasing testing time by testing each of the blocks in parallel. Furthermore, the adjustment of the phase of clocks becomes unnecessary between blocks during hierarchical layout operation.

Still in addition, since the Wrapper register arranged in the boundary area between blocks is made to be used as the synchronization flip-flop, a circuit of design for testability, as it is, can also be appropriated for logic with the metastability preventive feature.

Also, by operating the Wrapper register arranged in the boundary area between blocks as an internal scan chain in the present disclosure, the scan test operation by ATPG becomes feasible.

Since the Wrapper register 1312 can now be made in the state of self-monitoring, the scan test can be carried out on the blocks being unaffected from the exterior. As a result, the adjustment of the phase of clocks becomes unnecessary between blocks and the number of non-testable nodes in the block can be reduced.

Furthermore, the Wrapper register is arranged in the boundary area between blocks to be operated as an internal scan chain, and provided between the PRPG 1308 and MISR 1310 of logic BIST for testing internal logic included in blocks.

Since the Wrapper register 1312 can be made in the state of self-monitoring, the block is separated from the surrounding logics and able to serve to disconnect the x-propagation from the exterior. In addition, this construction of the Wrapper register is capable of reducing non-testable nodes in the block.

Additional modifications and variations of the present invention are possible in light of the above teachings. It is therefore to be understood that within the scope of the appended claims, the invention may be practiced other than as specifically described herein.

What is claimed as new and desired to be secured by Letters Patent of the United States is:

1. A semiconductor integrated circuit for use in a scan test operation, comprising: at least two blocks to be tested each for performing active functions; an isolation unit for isolating each of said at least two blocks to be tested exclusively from further blocks; and an input terminal for inputting a respective scan clock to each of said at least two blocks, said respective scan clocks input to said at least two blocks each having overlapping pulses and a phase different from each other.

2. The semiconductor integrated circuit according to claim 1, wherein said at least two blocks are isolated from one another and tested in parallel.

3. The semiconductor integrated circuit according to claim 1, wherein each of said at least two blocks is provided with a Core Wrapper Architecture as said isolation unit for use in a scan test operation.

4. A semiconductor integrated circuit for use in a scan test operation, comprising: at least two blocks to be tested each for performing active functions; an isolation unit for isolating each of said at least two blocks to be tested exclusively from further blocks; and an input terminal for inputting a respective scan clock to each of said at least two blocks, said respective scan clocks input to said at least two blocks each having a phase different from each other, wherein a Wrapper register included in a Core Wrapper Architecture is configured to be supplied selectively with one of a scan clock and a system clock for said blocks.

5. The semiconductor integrated circuit according to claim 4, further comprising: an internal scan chain in each of said at least two blocks, wherein a shift enable signal for said Wrapper register is connected to a scan enable signal for said internal scan chain, a clock for said Wrapper register is synchronous with a scan clock for said internal scan chain in said semiconductor integrated circuit, and serial-in and serial-out terminals of said Wrapper register are each connected to an exterior of said semiconductor integrated circuit, so that an application of scan data from a tester and an observation of results obtained from a test of said application both become feasible.

6. The semiconductor integrated circuit according to claim 5, further comprising: a logic built-in self test (BIST) in each of said at least two blocks, wherein serial-in and serial-out terminals of said Wrapper register are connected to an output of pseudo-random pattern generators (PRPG), and an input of multiple input serial register (MISR), of said logic BIST, respectively, each in parallel with said internal scan chain between said PRPG and said MISR.

7. A semiconductor integrated circuit capable of performing a scan test, the circuit comprising: at least two blocks to be tested each for performing active functions; an isolation unit for isolating each of said at least two blocks to be tested exclusively from further blocks; and a clock generator for generating a plurality of scan clocks based on a clock input from an exterior controller, a respective scan clock being supplied to each of said at least two blocks, said respective scan clocks supplied to said at least two blocks each having overlapping pulses and a phase different from each other.

8. The semiconductor integrated circuit according to claim 7, wherein said at least two blocks are isolated from one another and tested in parallel.

9. The semiconductor integrated circuit according to claim 7, wherein each of said at least two blocks is provided with a Core Wrapper Architecture as said isolation unit.

10. A semiconductor integrated circuit capable of performing a scan test, the circuit comprising: at least two blocks to be tested each for performing active functions; an isolation unit for isolating each of said at least two blocks to be tested exclusively from further blocks; and a clock generator for generating a plurality of scan clocks based on a clock input from an exterior controller, a respective scan clock being supplied to each of said at least two blocks, said respective scan clocks supplied to said at least two blocks each having a phase different from each other, wherein a Wrapper register included in a Core Wrapper Architecture is configured to be supplied selectively with one of a scan clock and a system clock for said blocks.

11. The semiconductor integrated circuit according to claim 10, further comprising: an internal scan chain in each of said at least two blocks, wherein a shift enable signal for said Wrapper register is connected to a scan enable signal for said internal scan chain, a clock for said Wrapper register is synchronous with a scan clock for said internal scan chain in said semiconductor integrated circuit, and serial-in and serial-out terminals of said Wrapper register are each connected to an exterior of said semiconductor integrated circuit, so that an application of scan data from a tester and an observation of results obtained from a test of said application both become feasible.

12. The semiconductor integrated circuit according to claim 11, further comprising: a logic BIST in each of said at least two blocks, wherein serial-in and serial-out terminals of said Wrapper register are connected to an output of PRPG, and an input of MISR, of said logic BIST, respectively, each in parallel with said internal scan chain between said PRPG and said MISR.

13. A semiconductor integrated circuit capable of performing a scan test, the circuit comprising: at least two block means to be tested each for performing active functions; means for isolating each of said at least two blocks to be tested exclusively from further block means; and terminal means for inputting a respective scan clock to each of said at least two block means, said respective scan clocks input to said at least two block means each having overlapping pulses and a phase different from each other.

14. The semiconductor integrated circuit according to claim 13, wherein said at least two block means are isolated from one another and tested in parallel.

15. The semiconductor integrated circuit according to claim 13, wherein each of said at least two block means is provided with a Core Wrapper Architecture as said means for isolating each of said at least two blocks to be tested.

16. A semiconductor integrated circuit capable of performing a scan test, the circuit comprising: at least two block means to be tested each for performing active functions; means for isolating each of said at least two blocks to be tested exclusively from further block means; and terminal means for inputting a respective scan clock to each of said at least two block means, said respective scan clocks input to said at least two block means each having a phase different from each other, wherein a Wrapper register included in a Core Wrapper Architecture is configured to be supplied selectively with one of a scan clock and a system clock for said block means.

17. The semiconductor integrated circuit according to claim 16, further comprising:
internal scan chain means in each of said at least two block means, wherein a shift enable signal for said Wrapper register means is connected to a scan enable signal for said internal scan chain means, a clock for said Wrapper register means is synchronous with a scan clock for said internal scan chain means in said semiconductor integrated circuit means, and serial-in and serial-out terminal means of said Wrapper register means are each connected to an exterior of said semiconductor integrated circuit means, so that an application of scan data from a tester means and an observation of results obtained from a test of said application both become feasible.

18. The semiconductor integrated circuit according to claim 17, further comprising:
logic BIST means in each of said at least two block means, wherein serial-in and serial-out terminals of said Wrapper register means are connected to an output means of PRPG, and an input means of MISR, of said logic BIST means, respectively, each in parallel with said internal scan chain means between said PRPG and said MISR.

19. A semiconductor integrated circuit capable of performing a scan test, the circuit comprising: at least two block means to be tested each for performing active functions; means for isolating each of said at least two block means to be tested exclusively from further block means; and means for generating a plurality of scan clocks based on a clock input from an exterior controller, a respective scan clock to be supplied to each of said at least two block means, said respective scan clocks supplied to said at least two blocks means each having overlapping pulses and a phase different from each other.

20. The semiconductor integrated circuit according to claim 19, wherein said at least two block means are isolated from one another and tested in parallel.

21. The semiconductor integrated circuit according to claim 19, wherein each of said at least two block means is provided with a Core Wrapper Architecture as said means for isolating each of said at least two blocks to be tested.

22. A semiconductor integrated circuit capable of performing a scan test, the circuit comprising: at least two block means to be tested each for performing active functions; means for isolating each of said at least two block means to be tested exclusively from further block means; and means for generating a plurality of scan clocks based on a clock input from an exterior controller, a respective scan clock to be supplied to each of said at least two block means, said respective scan clocks supplied to said at least two blocks means each having a phase different from each other, wherein a Wrapper register included in a Core Wrapper Architecture is configured to be supplied selectively with one of a scan clock and a system clock for said block means.

23. The semiconductor integrated circuit according to claim 22, further comprising: an internal scan chain means in each of said at least two block means, wherein a shift enable signal for said Wrapper register means is connected to a scan enable signal for said internal scan chain means, a clock for said Wrapper register means is synchronous with a scan clock for said internal scan chain means in said semiconductor integrated circuit means, and serial-in and serial-out terminal means of said Wrapper register means are each connected to an exterior of said semiconductor integrated circuit means, so that an application of scan data from a tester means and an observation of results obtained from a test of said application both become feasible.

24. The semiconductor integrated circuit according to claim 23, further comprising: a logic BIST in each of said at least two block means, wherein serial-in and serial-out terminals of said Wrapper register means are connected to an output means of PRPG, and an input means of MISR, of said logic BIST means, respectively, each in parallel with said internal scan chain means between said PRPG and said MISR.

* * * * *